(12) United States Patent
Kim

(10) Patent No.: US 7,439,841 B2
(45) Date of Patent: Oct. 21, 2008

(54) MULTI-LOOP TYPE TRANSFORMER

(75) Inventor: Seung-woo Kim, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 29 days.

(21) Appl. No.: 11/480,998

(22) Filed: Jul. 6, 2006

(65) Prior Publication Data

US 2007/0090913 A1    Apr. 26, 2007

(30) Foreign Application Priority Data

Oct. 26, 2005    (KR)    ................... 10-2005-0101183

(51) Int. Cl.
*H01F 5/00*    (2006.01)
(52) U.S. Cl. ................................... 336/200
(58) Field of Classification Search ........... 336/65, 336/83, 200, 232; 257/531; 333/33, 381
See application file for complete search history.

(56) References Cited

U.S. PATENT DOCUMENTS

| 3,785,046 | A | * | 1/1974 | Jennings | ................. | 29/602.1 |
| 4,376,274 | A | * | 3/1983 | Smart | ................. | 336/183 |
| 6,737,948 | B2 | * | 5/2004 | Aoki et al. | ................. | 336/200 |
| 6,980,075 | B2 | * | 12/2005 | Mheen et al. | ................. | 336/200 |

* cited by examiner

*Primary Examiner*—Tuyen T. Nguyen
(74) *Attorney, Agent, or Firm*—Sughrue Mion, PLLC

(57) ABSTRACT

A multi-loop transformer includes a first loop built with at least one metal plate forming a magnetic field with electric power supplied; a second loop, disposed in a concentric manner with the first loop, which generates induction current; at least one first sub-loop disposed in the concentric manner with the first loop, and electrically connected to the first loop, the second loop being disposed between the first sub-loop and the first loop; and electric power supply units, disposed between the respective metal plates of the first loop, which supplies electric power to each metal plate. Accordingly, the present invention can improve the efficiency of a power amplifier by reducing the loss of the distributive active transformer (DAT).

5 Claims, 4 Drawing Sheets

MULTI-LOOP TYPE TRANSFORMER

CROSS-REFERENCE TO RELATED APPLICATIONS

This application claims benefit under 35 U.S.C. § 119 from Korean Patent Application No. 10-2005-0101183, filed on Oct. 26, 2005, the entire contents of which are incorporated herein by reference.

BACKGROUND OF THE INVENTION

1. Field of the Invention

Apparatuses consistent with the present invention relate to a multi-loop type transformer, and more particularly, to a multi-loop type transformer capable of enhancing efficiency of a power amplifier by reducing power loss.

2. Description of the Related Art

In general, wireless communication equipment such as a handheld terminal employs semiconductor chip devices having radio frequency communication circuits built therein. Out of the chip devices, it is very important in terms of material cost reduction and transmitter efficiency to built as one single chip a transmitter and a high-frequency power amplifier having an appropriate power level. To build such a single chip, the power amplifier should be built with CMOS devices like the transmitter built with the CMOS devices. The CMOS device has difficulties in building the power amplifier since it has low breakdown voltage and substrate resistance. The technologies building a power amplifier overcoming such a low breakdown voltage and substrate resistance should be inevitably achieved for higher power output and efficiency improvement of integrated-circuit amplifier.

The distributed active transformer (DAT) is used to increase such a breakdown voltage of the power amplifier.

FIG. 1 is a circuit diagram for showing a conventional DAT. As shown in FIG. 1, the DAT has a first loop 10 to which electric power is supplied, second loop 20 generating induction current by current flowing in the first loop 10, and plural power supply units 60 for supplying power to the first loop 10.

The first loop 10 is formed with four metal plates disposed to be formed in a rectangular shape, and each metal plate serves as a drain tuning inductor for resonating the transistor parasitic capacitance and controlling a harmonic signal. Here, the metal plate inductor shows a higher Quality factor (Q-factor) than a spiral inductor.

Power supply units 60 are disposed between neighboring metal plates, and each interconnects the cathode terminals of output ports of the neighboring metal plates. Each power supply unit 60 is formed with a pair of transistors the sources of which are connected with each other and commonly grounded. One of the transistors is driven when its gate is supplied with a positive phase signal, and the other transistor is driven when its gate is supplied with a negative phase signal. Such power supply unit 60 causes each corner of the first loop 10 to be substantially AC-grounded.

The second loop 20 is formed with a metal plate of a rectangular frame shape forming one loop, and each side of the metal plate serves as one metal coil. That is, the second loop 20 generate induction current by the first loop 10 and serve as the second loop of the transformer.

The loss of such a DAT affects the efficiency of the whole module of a power amplifier, and, in particular, the DAT has a drawback of degrading the efficiency of the whole power amplifier when used as an output matching circuit of the power amplifier, since the loss of the DAT itself is large.

In general, the loss of the DAT becomes smaller as the metal plates forming the first loop 10 and the second loop 20 become thicker or as the virtual centers of the first loop 10 and the second loop 20 become closer. Here, the virtual center refers to a substantial center line of a magnetic field occurring when current flows in the first loop 10 and the second loop 20. Since the first loop 10 and the second loop 20 of the conventional DAT are a single loop respectively, the center line of the first and second loops 10 and 20 becomes a line connecting the centers in the traverse direction of the metal plates forming a loop.

However, in general, the thickness of a metal plate forming a loop of the DAT is determined at the time of a production process, and the current DAT structure having a single first loop 10 and a single second loop 20 causes the virtual centers of the respective loops to be considerably spaced apart.

Therefore, instead of thickening the thickness of the metal plate of the DAT, an approach is sought to compensate for the thickness and an approach is sought to shorten a distance between the virtual centers between the first loop 10 and the second loop 20, so the loss of the DAT is reduced to improve the efficiency of the power amplifier

SUMMARY OF THE INVENTION

The present invention has been developed in order to address the above and other aspects associated with the conventional arrangement. An aspect of the present invention is to provide a multi-loop type transformer capable of improving the efficiency of a power amplifier by reducing the transformer loss.

The foregoing and other aspects are substantially realized by providing a multi-loop transformer, comprising a first loop comprising at least one metal plate forming a magnetic field with electric power supplied; a second loop, disposed in a concentric manner with the first loop, which generates induction current; at least one first sub-loop spaced disposed in the concentric manner with the first loop and electrically connected to the first loop, the second loop being disposed between the first loop and one of the at least one first sub-loop; and at least one electric power supply unit which supplies electric power to the at least one metal plate.

The multi-loop transformer can further comprise at least one second sub-loop disposed in the concentric manner with the second loop and electrically connected with the second loop, and the one of the at least one first sub-loop is disposed between one of the at least one second sub-loop and the second loop.

Preferably, but not necessarily, if the number of the at least one first sub-loop is n, the number of the at least one second sub-loop is any of n−1 and n+1.

Preferably, but not necessarily, the at least one first sub-loop and the at least one second sub-loop are alternately disposed.

The first loop and the at least one first sub-loop as well as the second loop and the at least one second sub-loop can be connected one another by means of any of via holes and air bridges.

Further, the foregoing and other aspects are substantially realized by providing a multi-loop transformer, comprising a first loop comprising at least one metal plate forming a magnetic field with electric power supplied; a second loop, disposed in a concentric manner with the first loop, which generates induction current; at least one second sub-loop disposed in the concentric manner with the second loop and electrically connected to the second loop, the first loop being disposed between one of the at least one second sub-loop and the second loop; and at least one electric power supply unit which supplies electric power to the at least one metal plate.

BRIEF DESCRIPTION OF THE DRAWINGS

The above aspects and features of the present invention will be more apparent by describing certain exemplary embodiments of the present invention with reference to the accompanying drawings, in which.

DESCRIPTION OF THE EXEMPLARY EMBODIMENTS

Hereinafter, the present invention will be described in detail with reference to the accompanying drawings.

Figure 1:
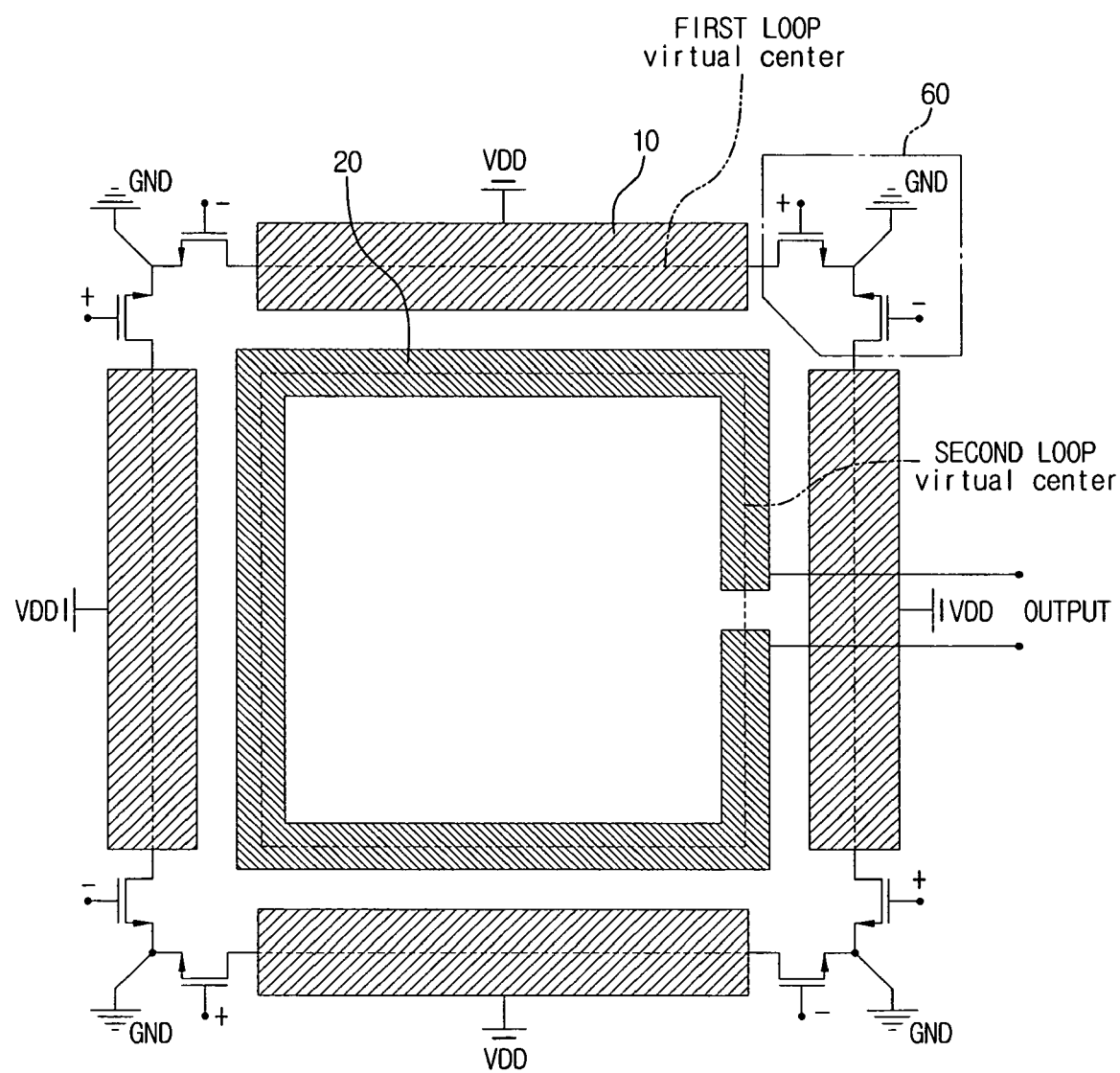
FIG. 1 is a circuit diagram for showing a conventional DAT.
Figure 2:
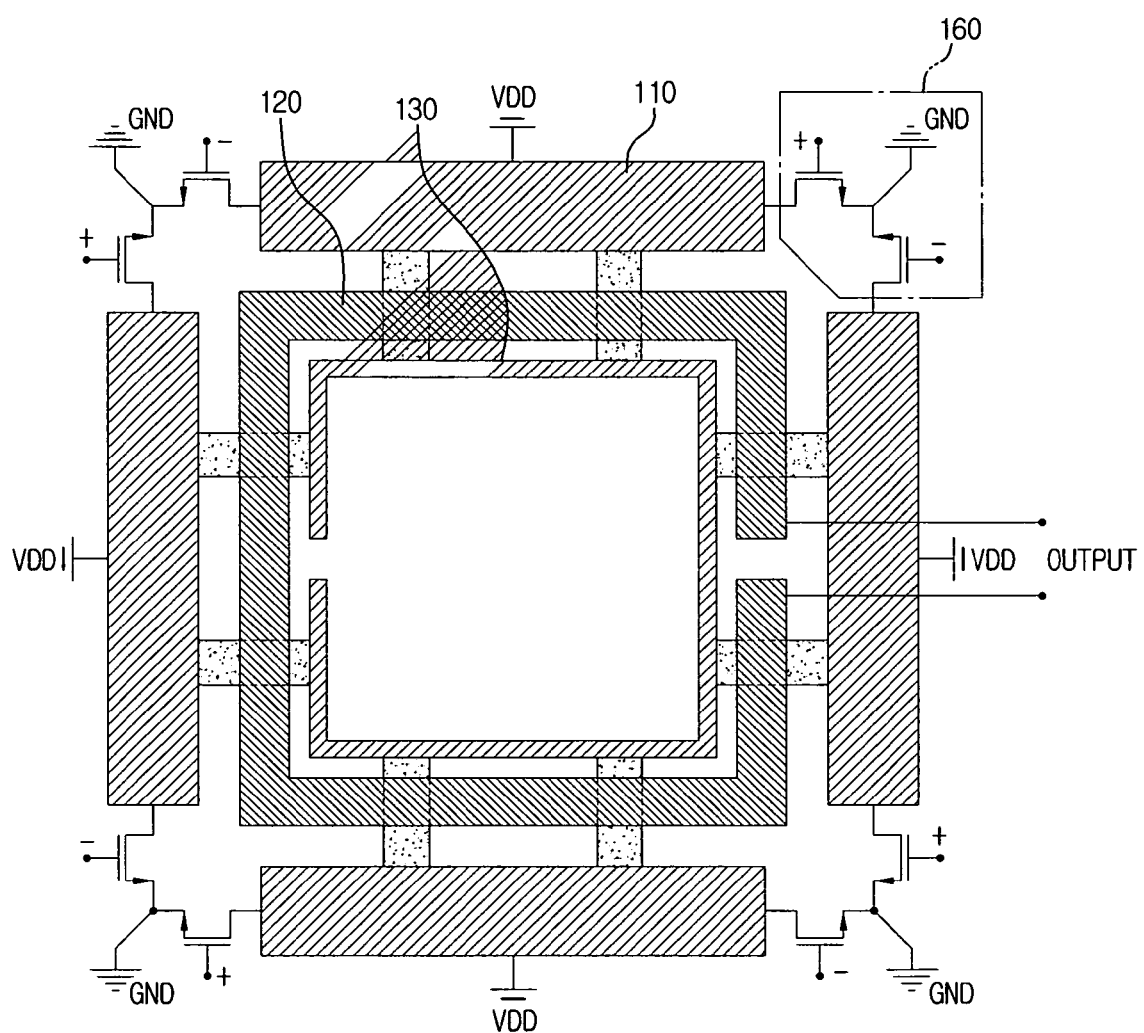
FIG. 2 is a circuit diagram for showing a DAT according to a first exemplary embodiment of the present invention.

FIG. 2 is a circuit diagram for showing a DAT according to a first exemplary embodiment of the present invention. As shown in FIG. 2, the DAT according to the first exemplary embodiment has a first loop 110, a first sub-loop 130, a second loop 120, and the power supply units 160.

The first loop 110 is supplied with electric power from the power supply units 160 to generate a magnetic field, and are formed with four metal plates disposed to form a rectangular shape. Here, the first loop 110 may have one or more metal plates and the first loop 110 may also have four or more metal plates. Here, as the numbers of the metal plates and the power supply units 160 are increased, the output power capacity of the whole circuit can be increased.

The first sub-loop 130 is formed in a rectangular loop disposed inside the second loop 120, and has an opening in one side thereof. The first sub-loop 130 is electrically connected to the first loop 110, and has current flowing in the same direction as that of the first loop 110, thereby forming a magnetic field like the first loop 110. The first loop 110 is connected with the first sub-loop 130 through a lower-layer metal with via holes formed on the substrate or through air bridges formed over the first loop 110 and the first sub-loop 130. Further, when the first loop 110 and the first sub-loop 130 are connected to each other, one or more via holes or air bridges are formed in or over each metal plate of the first loop 110 so that electric power is smoothly supplied from each power supply unit 160 to the first sub-loop 130.

The power supply units 160 supply electric power to the first loop 110, and are disposed between the metal plates forming the first loop 110, thereby connecting the cathode electrodes of the respective neighboring metal plate output ports. Each power supply unit 160 is formed with a pair of transistors such as CMOS's, MOSFETs, and so on. Explanation is made as below with the power supply unit 160 formed with MOSFETs, for example. The sources of the respective MOSFETs are connected with each other and commonly grounded, one of the MOSFETs of the power supply unit 160 is driven by a positive phase signal applied to the gate, and the other is driven by a negative phase signal applied to the gate. The power supply unit 160 causes the AC ground to be substantially generated between the respective metal plates of the first loop 110.

The second loop 120 is formed with a metal plate shaped in a rectangular frame with an opening in one side thereof, and disposed between the first loop 110 and the first sub-loop 130. The second loop 120 generates induction current by a magnetic field caused by the first loop 110 and the first sub-loop 130, and causes current to flow in the direction opposite to the first loop 110 and the first sub-loop 130.

In the DAT having the above structure, the virtual center of a magnetic field caused by the first loop 110 and the first sub-loop 130 due to the disposition of the first sub-loop 130 is created between the first loop 110 and the first sub-loop 130, that is, in an area adjacent to the second loop 120 or on the second loop 120. Further, since the virtual center of the second loop 120 is created in the central area in the width direction of the second loop 120, the virtual center created by the first loop 110 and the first sub-loop 130 becomes overlapping with or very adjacent to the virtual center of the second loop 120. Therefore, since the first loop 110 and the second loop 120 has a stronger magnetic coupling therebetween, the K-factor is improved which is one of the factors affecting the loss of the DAT. Further, as the first loop 110 and the first sub-loop 130 serve as the first loop 110, the width of the metal plates forming the first loop 110 becomes substantially wider so that the metal resistance is reduced and the Q-factor is improved.

As above, the DAT narrows a distance between the virtual centers of the first loop 110 and the second loop 120 and substantially expands the width of the first loop 110, thereby improving both the K-factor and the Q-factor. Accordingly, the loss of the DAT can be reduced as well as the performance of a power amplifier used for the DAT can be improved.

Figure 3:
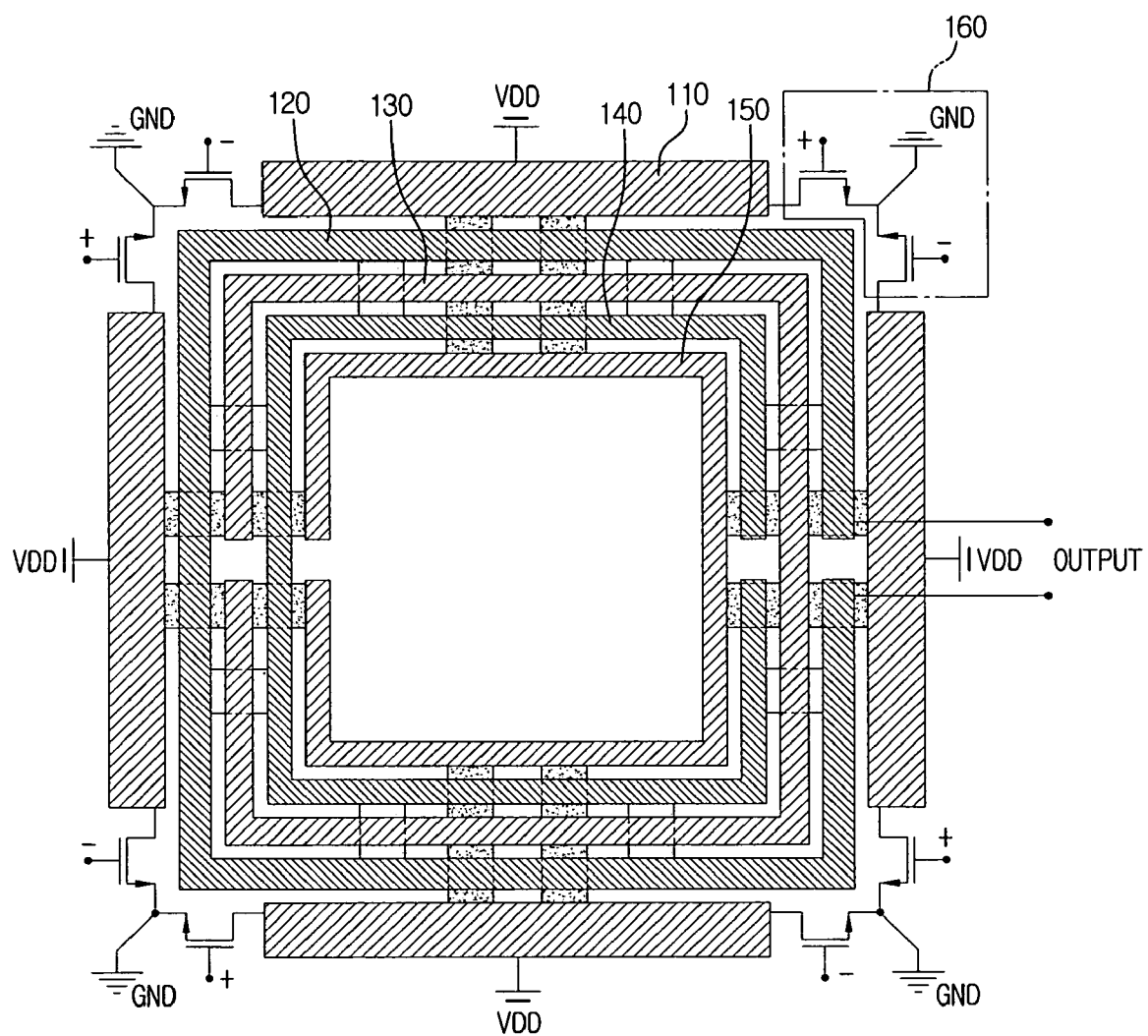
FIG. 3 is a circuit diagram for showing a DAT according to a second exemplary embodiment of the present invention.

FIG. 3 is a circuit diagram for a DAT according to a second exemplary embodiment of the present invention. As shown in FIG. 3, the second exemplary embodiment of the present invention has the first loop 110, a pair of first sub-loops 130 and 150, the second loop 120, a second sub-loop 140, and the power supply units 160.

The DAT of the second exemplary embodiment has the first loop 110, the second loop 120, one first sub-loop 130, the second sub-loop 140, and the remaining first sub-loop 150 which are disposed in order from the outermost.

Here, as in the above exemplary embodiment, the first loop 110 and the pair of first sub-loop 130 and 150 are electrically connected to each other by use of via holes or air bridges, and cause current to flow in the same direction when electric power is supplied. The virtual center of a magnetic field formed by the first loop 110 and the pair of first sub-loops 130 and 150 is created in the central area of the first loop 110 and the pair of first sub-loops 130 and 150, that is, over the first sub-loop 130 adjacent to the first loop 110 or adjacent to the first sub-loop 130.

The second loop 120 and the second sub-loop 140 are electrically connected by use of via holes and air bridges or bridges by lower-layer metal, and have induction current caused by a magnetic field generated by the first loop 110 and the pair of first sub-loops 130 and 150. Further, the virtual center of a magnetic field formed by the second loop 120 and the second sub-loop 140 is created between the second loop 120 and the second sub-loop 140, that is, over the first sub-loop 130 adjacent to the first loop 110 or adjacent to the first sub-loop 130.

Accordingly, the virtual center of the magnetic field formed by the first loop 110 and the pair of first sub-loops 130 and 150 is created very closely to the virtual center of a magnetic field formed by the second loop 120 and the second sub-loop 140. Thus, the K-factor of the DAT is improved.

Further, since the first loop 110 and the pair of first sub-loops 130 and 150 as well as the second loop 120 and the second sub-loop 140 cause a substantial effect of increasing the width of the metal plates, the Q-factor of the DAT is improved.

Meantime, the above first exemplary embodiment is provided with one more first loop 100, and the second exemplary embodiment has three first loops 110 and two second loops 120 formed therein. However, more sub-loops for the first loop 110 and the second loop 120 can be built, and, here, the second loops 120 are formed in an even number if the first loops 110 are formed in an odd number, and the second loops 120 are formed in an odd number if the first loops 110 are formed in an even number. Further, more of the second loops 120 can be built in number than the first loops 110, but it is preferable, but not necessary, that the first loops 110 are built one more in number than the second loops 120. That is, if the number of the first loops 110 is n, the number of the second loops 120 to be built can be (n−1). However, if (n−1) first loops 110 are built and n second loops 120 are built, the second sub-loop 140 is disposed outside the first loops 110 since there is one more second loop 120 in number.

Figure 4:
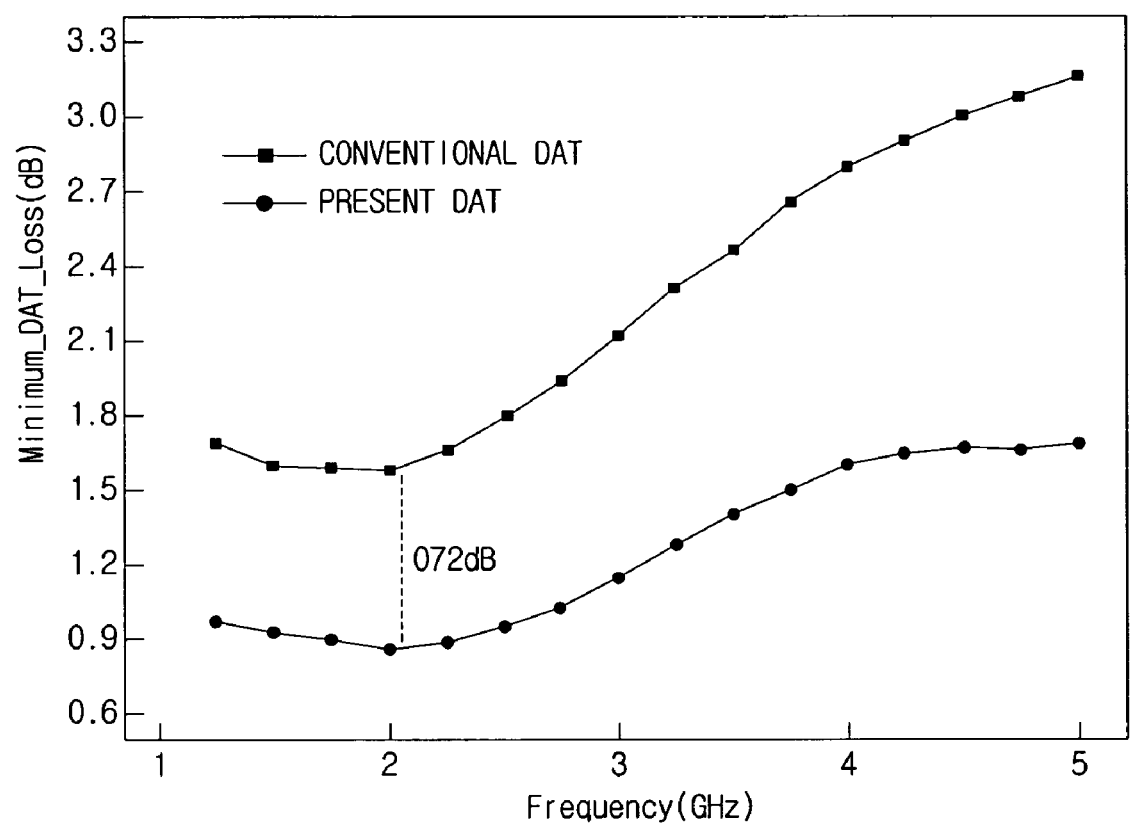
FIG. 4 is a graph for showing comparisons of losses between an exemplary embodiment the present invention and the conventional DAT.

FIG. 4 is a graph for showing comparisons of losses between an exemplary embodiment of the present invention and the conventional DAT. As shown in FIG. 4, the exemplary embodiment of the present invention has less loss compared to the conventional DAT. At a frequency of 2 GHz, the DAT of the exemplary embodiment of the present invention shows a 0.72 dB less loss compared to the conventional DAT, and the loss of the DAT of the exemplary embodiment of the present invention is about half of the conventional DAT loss.

Table 1 as below shows the comparisons between the DAT of the exemplary embodiment of the present invention and the conventional DAT with respect to how the loss of the DAT affects the efficiency of a power amplifier.

TABLE 1

| | PA performance | | PAE | |
| --- | --- | --- | --- | --- |
| | PAE | Gain | DAT Loss = 1.4 dB | DAT Loss = 0.78 dB |
| Linear power amplifier | 50% | 25 dB | 36% | 41.8% (Δ = 5.8%) |
| Switching power amplifier | 75% | 25 dB | 54% | 62.7% (Δ = 8.7%) |

As shown in Table 1 as above, in the linear power amplifier, if the loss of the DAT is 1.4 dB, that is, if the conventional DAT is used, the power amplifier efficiency (PAE) is 36%, but, if the loss of the DAT is 0.78 dB, that is, if the DAT of the exemplary embodiment of the present invention is used, the power amplifier efficiency (PAE) is increased to 41.8% by 5.8%. In the switching power amplifier, the conventional DAT has the PAE of 54%, but the DAT of the exemplary embodiment of the present invention has the PAE of 62.6% increased by 8.7%.

As above, since the DAT of the exemplary embodiment of the present invention is built with plural first loops 110 and second loops 120 to have the virtual centers of the first and second loops 110 and 120 become close to each other so that the widths of the first and second loops 110 and 120 are substantially increased, the K-factor and Q-factor can be improved. Since such improvements reduce the loss of the DAT, the efficiency of the power amplifier can be improved.

Meantime, the DATs in the above exemplary embodiments are built with plural loops for the first loops 110 and the second loops 120, but a plurality of the first loops 110 and the second loops 120 can be built by applying to the typical spiral transformer, or a plurality of inductor loops can be built by applying to an inductor.

As aforementioned, the exemplary embodiment of the present invention can improve the efficiency of a power amplifier by reducing the loss of the DAT.

The foregoing embodiments and aspects are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A multi-loop transformer, comprising:
    a first loop comprising at least one metal plate forming a magnetic field with electric power supplied;
    a second loop, disposed in a concentric manner with the first loop, which generates induction current;
    at least one first sub-loop disposed in the concentric manner with the first loop and electrically connected to the first loop, the second loop being disposed between one of the at least one first sub-loop and the first loop;
    at least one electric power supply unit which supplies electric power to the at least one metal plate; and
    at least one second sub-loop disposed in the concentric manner with the second loop and electrically connected with the second loop, the one of the at least one first sub-loop being disposed between one of the at least one second sub-loop and the second loop,
    wherein, if a number of the at least one first sub-loop is n, then a number of the at least one second sub-loop is n−1.

2. The multi-loop transformer as claimed in claim 1, wherein the at least one first sub-loop and the at least one second sub-loop are alternately disposed.

3. The multi-loop transformer as claimed in claim 2, wherein the first loop and the at least one first sub-loop are connected one another by means of any of via holes and air bridges, and the second loop and the at least one second sub-loop are connected one another by means of any of via holes and air bridges.

4. A multi-loop transformer, comprising:
    a first loop comprising at least one metal plate forming a magnetic field with electric power supplied;
    a second loop, disposed in a concentric manner with the first loop, which generates induction current;
    at least one first sub-loop disposed in the concentric manner with the first loop and electrically connected to the first loop, wherein the at least one first sub-loop is disposed such that a virtual center of the second loop substantially overlaps with a virtual center created by the first loop and the at least one first sub-loop;
    at least one electric power supply unit which supplies electric power to the at least one metal plate; and
    at least one second sub-loop disposed in the concentric manner with the second loop and electrically connected with the second loop, the one of the at least one first sub-loop being disposed between one of the at least one second sub-loop and the second loop,
    wherein, if a number of the at least one first sub-loop is n, then a number of the at least one second sub-loop is n−1.

5. The multi-loop transformer as claimed in claim 4, wherein the multi-loop transformer is a distributive active transformer (DAT).

* * * * *